(12) United States Patent
Hotta

(10) Patent No.: US 8,853,701 B2
(45) Date of Patent: Oct. 7, 2014

(54) SEMICONDUCTOR DEVICE, DISPLAY DEVICE, AND PRODUCTION METHOD FOR SEMICONDUCTOR DEVICE AND DISPLAY DEVICE

(75) Inventor: Kazushige Hotta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 214 days.

(21) Appl. No.: 13/643,923

(22) PCT Filed: Mar. 17, 2011

(86) PCT No.: PCT/JP2011/056421
§ 371 (c)(1),
(2), (4) Date: Nov. 16, 2012

(87) PCT Pub. No.: WO2011/135945
PCT Pub. Date: Nov. 3, 2011

(65) Prior Publication Data
US 2013/0175535 A1    Jul. 11, 2013

(30) Foreign Application Priority Data

Apr. 28, 2010 (JP) ................................. 2010-104459

(51) Int. Cl.
*H01L 21/00* (2006.01)
*H01L 21/8238* (2006.01)
*H01L 27/12* (2006.01)
*H01L 27/092* (2006.01)
*H01L 29/786* (2006.01)

(52) U.S. Cl.
CPC .......... *H01L 27/092* (2013.01); *H01L 21/8238* (2013.01); *H01L 27/1222* (2013.01); *H01L 29/78696* (2013.01); *H01L 27/1214* (2013.01)

USPC .................................. 257/66; 257/59; 257/72

(58) Field of Classification Search
CPC ............ H01L 27/1214; H01L 27/1222; H01L 29/78696; H01L 27/092; H01L 29/789696; H01L 21/8238
USPC .................................................. 257/66, 59, 72
See application file for complete search history.

(56) References Cited

U.S. PATENT DOCUMENTS

| 6,043,128 A * | 3/2000 | Kamiya ........................ 438/289 |
| 6,184,094 B1 * | 2/2001 | Goto ............................. 438/276 |
| 6,207,510 B1 * | 3/2001 | Abeln et al. .................. 438/276 |

(Continued)

FOREIGN PATENT DOCUMENTS

| JP | 9-027553 A | 1/1997 | |
| JP | 10223774 A * | 8/1998 | .......... H01L 21/8238 |

(Continued)

Primary Examiner — Laura Menz
(74) Attorney, Agent, or Firm — Chen Yoshimura LLP

(57) ABSTRACT

In order to efficiently manufacture a semiconductor device having a plurality of TFTs formed thereon, which can be applied to a variety of uses, a semiconductor device (100) is disclosed that is provided with a first P-type TFT (10a), a second P-type TFT (10b), a first N-type TFT (10c), and a second N-type TFT (10d), each having a channel region that is formed of polycrystalline silicon. When d1, d2, d3, and d4 respectively represent the concentrations of p-type impurities in the respective channel regions of the TFTs (10a to 10d), at least three values out of d1, d2, d3, and d4 are mutually different, and d1, d2, d3, and d4 satisfy relations of d1<d2 and d3<d4.

2 Claims, 11 Drawing Sheets

(56) References Cited

U.S. PATENT DOCUMENTS

| | | | |
|---|---|---|---|
| 6,531,363 B2 * | 3/2003 | Uchida | 438/275 |
| 6,562,675 B1 * | 5/2003 | Watt | 438/217 |
| 6,740,939 B2 * | 5/2004 | Sayama et al. | 257/371 |
| 6,803,285 B2 * | 10/2004 | Mistry et al. | 438/276 |
| 6,921,948 B2 * | 7/2005 | Watt | 257/369 |
| 7,224,224 B2 * | 5/2007 | Sera et al. | 330/253 |
| 7,335,561 B2 * | 2/2008 | Sakai et al. | 438/275 |
| 7,560,772 B2 * | 7/2009 | Sakai et al. | 257/336 |
| 7,569,898 B2 * | 8/2009 | Kato et al. | 257/392 |
| 7,589,383 B2 * | 9/2009 | Yanase | 257/351 |
| 7,619,288 B2 * | 11/2009 | Hotta | 257/402 |
| 7,687,353 B2 * | 3/2010 | Jang | 438/276 |
| 7,741,677 B2 * | 6/2010 | Sakai et al. | 257/336 |
| 7,897,467 B2 * | 3/2011 | Sakai et al. | 438/275 |
| 8,471,258 B2 * | 6/2013 | Sakakura et al. | 257/59 |
| 2004/0046209 A1 * | 3/2004 | Sera et al. | 257/350 |
| 2008/0191214 A1 * | 8/2008 | Hotta | 257/72 |
| 2013/0043480 A1 * | 2/2013 | Adachi | 257/71 |
| 2013/0175535 A1 * | 7/2013 | Hotta | 257/66 |

FOREIGN PATENT DOCUMENTS

| | | | | |
|---|---|---|---|---|
| JP | 2001-284596 A | | 10/2001 | |
| JP | 2004-128487 A | | 4/2004 | |
| JP | 2004128487 A | * | 4/2004 | ............ H01L 29/786 |
| WO | WO 2011078335 A1 | * | 6/2011 | |
| WO | WO 2011135945 A1 | * | 11/2011 | |

* cited by examiner (a)

| D | | 22a | 22b | 22c | 22d |
|---|---|---|---|---|---|
| 1 | a | - | ○ | ○ | ○ |
| 2 | b(>a) | - | - | - | ○ |
| Total | | - | a | a | a+b |

(b)

| D | | 22a | 22b | 22c | 22d |
|---|---|---|---|---|---|
| 1 | a | - | - | - | ○ |
| 2 | b(>a) | - | ○ | ○ | ○ |
| Total | | - | b | b | a+b |

(c)

| D | | 22a | 22b | 22c | 22d |
|---|---|---|---|---|---|
| 1 | a | ○ | - | ○ | ○ |
| 2 | b(>a) | - | ○ | - | ○ |
| Total | | a | b | a | a+b |

(d)

| D | | 22a | 22b | 22c | 22d |
|---|---|---|---|---|---|
| 1 | a | ○ | - | - | ○ |
| 2 | b(>a) | - | ○ | ○ | ○ |
| Total | | a | b | b | a+b |

(e)

| D | | 22a | 22b | 22c | 22d |
|---|---|---|---|---|---|
| 1 | c | ○ | ○ | ○ | ○ |
| 2 | a | - | ○ | ○ | ○ |
| 3 | b(>a) | - | - | - | ○ |
| Total | | c | c+a | c+a | c+a+b |

| | D | 22a | 22b | 22c | 22d |
|---|---|---|---|---|---|
| 1 | a | ○ | - | ○ | - |
| 2 | b(>a) | - | ○ | - | ○ |
| | Total | a | b | a | b |

(b)

| | D | 22a | 22b | 22c | 22d |
|---|---|---|---|---|---|
| 1 | c | ○ | ○ | ○ | ○ |
| 2 | a | - | ○ | - | ○ |
| | Total | c | c+a | c | c+a |

SEMICONDUCTOR DEVICE, DISPLAY DEVICE, AND PRODUCTION METHOD FOR SEMICONDUCTOR DEVICE AND DISPLAY DEVICE

TECHNICAL FIELD

The present invention relates to a semiconductor device provided with a plurality of thin-film transistors (TFTs). The present invention also relates to a semiconductor device that is used for a display device such as a liquid crystal display device and an organic EL display device, and a display device provided with such semiconductor device.

BACKGROUND ART

In recent years, a liquid crystal display device, an organic EL display device, and the like have been used for a display device for a portable mobile device, a notebook computer, a television, and the like. These display devices are provided with an active matrix substrate as a semiconductor device. On the active matrix substrate, TFTs are formed. These TFTs switch voltages to be applied to pixel electrodes in a plurality of respective pixels that are disposed in a matrix. Further, on the active matrix substrate, TFTs of driving circuits are disposed on a periphery of a display region. These TFTs control a display voltage, a gate voltage, and the like that are applied to the plurality of pixels. For such TFTs, amorphous silicon TFTs, microcrystalline silicon TFTs, polycrystalline silicon (polysilicon) TFTs, and the like are used.

Patent Document 1 discloses an example of a semiconductor device that is provided with a plurality of TFTs. The semiconductor device disclosed therein is provided with two types of n-channel type TFTs and two types of p-channel type TFTs. These n-channel type TFTs and p-channel type TFTs respectively have active layers made of polycrystalline silicon. The two types of the n-channel type TFTs have two types of TFTs that respectively have threshold voltages (Vt) different from each other. Also, the two types of the p-channel type TFTs have two types of TFTs that respectively have threshold voltages different from each other. The channel region out of the two types of the n-channel type TFTs and the channel region out of the two types of the p-channel type TFTs are respectively doped with a dopant having the same concentration. The other channel region out of the two types of the n-channel type TFTs and the other channel region out of the two types of the p-channel type TFTs are set to non-doped regions that are not doped with a dopant.

RELATED ART DOCUMENT

Patent Document

Patent Document 1: Japanese Patent Application Laid-Open Publication No. 2004-128487

SUMMARY OF THE INVENTION

Problems to be Solved by the Invention

On a substrate of a display device such as a liquid crystal display device, a display area and driver circuits are formed. The display area is constituted of pixels disposed in a matrix. The driver circuits such as a gate driver and a data driver are formed outside of the display area. With the advancement of a thin film forming technology in recent years, it has become possible to simultaneously form TFTs disposed on the display area and TFTs used for the driver circuits and the like on the same substrate using polycrystalline silicon.

On such a TFT substrate of the display device or on a TFT substrate of a device that requires high functionality, logic circuits and circuits for processing an analog voltage are formed, for example. The logic circuits digitally process low-level and high-level values in binary. The circuits for processing an analog voltage control a voltage applied to pixel electrodes and the like, for example. Various types of TFTs having different characteristics, which respectively suit for these circuits, are simultaneously formed on the TFT substrate.

The TFTs used for the logic circuits or for switches need to allow a current that is necessary for switching to flow therein in an ON state, and are required to minimize a current flowing therein in an OFF state to suppress a leak current. On the other hand, the TFTs that control an analog voltage must assume an ON state for a longer period of time, and it is therefore important for such TFTs to be capable of accurately controlling a source and drain voltage in the ON state across a wide voltage range.

In order to drive liquid crystal in a display region in a liquid crystal display device, for example, it is required to apply a voltage ranged from about 0V to a high voltage that is 10V or more to pixel electrodes. To highly accurately control a source and drain voltage in such a wide range, it is preferable that a threshold voltage of the TFTs be kept low. At the same time, for peripheral circuits that are required to operate accurately with high speed by a relatively low voltage, it is required not to increase consumption power more than necessary. A demand for reducing power consumption of various devices has become stronger in recent years, in particular, to extend a driving time of mobile devices and to respond to environmental problems and the like. Therefore, it has become important to achieve a configuration in which a plurality of TFTs for various purposes are provided in a single device, while suppressing a leak current thereof as much as possible.

However, when TFTs having the same impurity concentration in respective channel regions are used for circuits that have mutually different driving voltages, a low-voltage driven TFT may have a higher threshold voltage and a larger leak current than those of a high-voltage driven TFT, which results in a problem. The semiconductor device described in Patent Document 1 has a problem of not being able to fully address this problem because, in this semiconductor device, the channel regions of the plurality of TFTs have two different impurity concentrations. Also, because the impurity concentration is the same between one of two types of the p-type TFTs and one of two types of the n-type TFTs, it is not easy to reduce the threshold voltages of both the p-type TFT and the n-type TFT to substantially the same value.

One of the possible solutions to these problems would be to shorten the channel length in the low-voltage driven TFTs, for example. However, it was not able to sufficiently reduce the threshold voltage to the required value. Another possible solution to the above problems would be to dope each of the TFTs in a different manner in a TFT forming process such that the impurity concentrations of the channel regions differ in the respective TFTs. However, this would make a manufacturing process complex, thereby causing a problem of higher manufacturing cost and longer manufacturing time.

The present invention was made to solve such problems, and one of the object is to provide a semiconductor device or a display device that is provided with various types of TFTs capable of being appropriately applied to various uses with high manufacturing efficiency. Another object of the present invention is to provide a multifunctional semiconductor device or a display device that consumes less power with high manufacturing efficiency.

Means for Solving the Problems

A semiconductor device according to the present invention is provided with: a first P-type TFT; a second P-type TFT; a first N-type TFT; and a second N-type TFT, each of which has a channel region that is made of polycrystalline silicon, wherein at least three values out of impurity concentrations d1, d2, d3, and d4 differ from each other, and d1, d2, d3, and d4 satisfy relations of d1<d2 and d3<d4, where d1, d2, d3, and d4 respectively represent p-type impurity concentrations in the respective channel regions in the first P-type TFT, the second P-type TFT, the first N-type TFT, and the second N-type TFT.

In an embodiment, the first P-type TFT and the second N-type TFT are high-voltage driven TFTs, and the second P-type TFT and the first N-type TFT are low-voltage driven TFTs that control a source-drain voltage lower than a source-drain voltage controlled by the high-voltage driven TFTs.

In an embodiment, four values of d1, d2, d3, and d4 differ from each other.

In an embodiment, d1, d2, d3, and d4 satisfy a relation of d1<d2<d3<d4 or a relation of d1<d3<d2<d4.

In an embodiment, three values out of d1, d2, d3, and d4 differ from each other, and two values out of d1, d2, d3, and d4 are equal to each other.

In an embodiment, d1, d2, d3, and d4 satisfy a relation of d1<d2=d3<d4 or a relation of d1=d3<d2<d4.

In an embodiment, d1, d2, d3, and d4 respectively represent values that are derived by subtracting respective n-type impurity concentrations (including a case where the concentration is zero) from respective p-type impurity concentrations (including a case where the concentration is zero) in the respective channel regions in the first P-type TFT, the second P-type TFT, the first N-type TFT, and the second N-type TFT.

A display device according to the present invention is a display device that is provided with the above-mentioned semiconductor device.

Another semiconductor device according to the present invention is provided with: a first P-type TFT; a second P-type TFT; a first N-type TFT; and a second N-type TFT, each of which has a channel region that is made of polycrystalline silicon, wherein the first P-type TFT and the second N-type TFT are high-voltage driven TFTs, and the second P-type TFT and the first N-type TFT are low-voltage driven TFTs that control a source-drain voltage lower than a source-drain voltage controlled by the high-voltage driven TFTs, and wherein impurity concentrations d1, d2, d3, and d4 satisfy a relation of d1=d3<d2, d1=d3<d4, d1<d2=d4, or d3<d2=d4, where d1, d2, d3, and d4 respectively represent p-type impurity concentrations in the respective channel regions in the first P-type TFT, the second P-type TFT, the first N-type TFT, and the second N-type TFT.

In an embodiment, d1, d2, d3, and d4 satisfy a relation of d1=d3<d2=d4.

In an embodiment, d1, d2, d3, and d4 respectively represent values that are derived by subtracting respective n-type impurity concentrations (including a case where the concentration is zero) from respective p-type impurity concentrations (including a case where the concentration is zero) in the respective channel regions in the first P-type TFT, the second P-type TFT, the first N-type TFT, and the second N-type TFT.

Another display device according to the present invention is a display device that is provided with the above-mentioned semiconductor device.

A manufacturing method of a semiconductor device according to the present invention is a manufacturing method of a semiconductor device that is provided with a first P-type TFT, a second P-type TFT, a first N-type TFT, and a second N-type TFT, each of which has a channel region that is made of polycrystalline silicon, the method including: a first step of simultaneously doping a first amount of an impurity in at least one region out of a first region, a second region, a third region, and a fourth region that respectively become channel regions of the first P-type TFT, the second P-type TFT, the first N-type TFT, and the second N-type TFT; and a second step of simultaneously doping a second amount of an impurity, which differs from the first amount, in a plurality of regions that include at least one region doped with the impurity in the first step out of the first region, the second region, the third region, and the fourth region, the second step being performed before or after the first step, wherein impurity concentrations d1, d2, d3, and d4 satisfy relations of d1<d2 and d3<d4, where d1, d2, d3, and d4 respectively represent concentrations of a p-type impurity that is doped in the first region, the second region, the third region, and the fourth region.

In an embodiment, the first P-type TFT and the second N-type TFT are high-voltage driven TFTs, and the second P-type TFT and the first N-type TFT are low-voltage driven TFTs that control a source-drain voltage lower than a source-drain voltage controlled by the high-voltage driven TFTs.

In an embodiment, in the first step, the first amount of the impurity is simultaneously doped in two regions out of the first region, the second region, the third region, and the fourth region, and in the second step that is performed after the first step, the second amount of an impurity, which differs from the first amount, is simultaneously doped in one region that was doped with the impurity in the first step and in one region that was not doped with the impurity in the first step, out of the first region, the second region, the third region, and the fourth region.

In an embodiment, four values of d1, d2, d3, and d4 differ from each other.

In an embodiment, d1, d2, d3, and d4 satisfy a relation of d1<d2<d3<d4 or a relation of d1<d3<d2<d4.

In an embodiment, in the first step, the first amount of the impurity is simultaneously doped in the second region and the fourth region, and in the second step, the second amount of the impurity, which is greater than the first amount, is simultaneously doped in the third region and the fourth region.

In an embodiment, in the first step, the first amount of the impurity is simultaneously doped in the third region and the fourth region, and in the second step, the second amount of impurity, which is greater than the first amount, is simultaneously doped in the second region and the fourth region.

An embodiment has a third step of doping a third amount of an impurity in the first region, the second region, the third region, and the fourth region.

In an embodiment, three values out of d1, d2, d3, and d4 differ from each other, and two values out of d1, d2, d3, and d4 are equal to each other.

In an embodiment, d1, d2, d3, and d4 satisfy a relation of d1<d2=d3<d4 or a relation of d1=d3<d2<d4.

In an embodiment, in the first step, the first amount of the impurity is simultaneously doped in the second region, the third region, and the fourth region, and in the second step, the second amount of the impurity, which is greater than the first amount, is doped in the fourth region.

In an embodiment, in the first step, the first amount of the impurity is doped in the fourth region, and in the second step, the second amount of the impurity, which is greater than the first amount, is simultaneously doped in the second region, the third region, and the fourth region.

In an embodiment, in the first step, the first amount of the impurity is simultaneously doped in the first region, the third region, and the fourth region, and in the second step, the second amount of the impurity, which is greater than the first amount, is simultaneously doped in the second region and the fourth region.

In an embodiment, in the first step, the first amount of the impurity is simultaneously doped in the first region and the fourth region, and in the second step, the second amount of the impurity, which is greater than the first amount, is simultaneously doped in the second region, the third region, and the fourth region.

An embodiment has a step of further doping a third amount of an impurity simultaneously in the first region, the second region, the third region, and the fourth region.

In an embodiment, d1, d2, d3, and d4 respectively represent values that are derived by subtracting respective n-type impurity concentrations (including a case where the concentration is zero) from respective p-type impurity concentrations (including a case where the concentration is zero) in the respective channel regions of the first P-type TFT, the second P-type TFT, the first N-type TFT, and the second N-type TFT.

A manufacturing method of a display device according to the present invention is a manufacturing method of a display device that includes the above-mentioned manufacturing method.

A manufacturing method of another semiconductor device according to the present invention is a manufacturing method of a semiconductor device that is provided with a first P-type TFT, a second P-type TFT, a first N-type TFT, and a second N-type TFT, each of which has a channel region that is made of polycrystalline silicon, wherein the first P-type TFT and the second N-type TFT are high-voltage driven TFTs, and the second P-type TFT and the first N-type TFT are low-voltage driven TFTs that control a source-drain voltage lower than a source-drain voltage controlled by the high-voltage driven TFTs, the method including: a first step of simultaneously doping a first amount of an impurity in a first region that becomes a channel region of the first P-type TFT and in a third region that becomes a channel region of the first N-type TFT; and a second step of simultaneously doping a second amount of an impurity, which differs from the first amount, in a second region that becomes a channel region of the second P-type TFT and in a fourth region that becomes a channel region of the second N-type TFT, wherein impurity concentrations d1, d2, d3, and d4 satisfy a relation of d1=d3<d2, d1=d3<d4, d1<d2=d4, or d3<d2=d4, where d1, d2, d3, and d4 respectively represent concentrations of a p-type impurity that is doped in the first region, the second region, the third region, and the fourth region.

In an embodiment, d1, d2, d3, and d4 satisfy a relation of d1=d3<d2=d4.

In an embodiment, in the first step, the first amount of the impurity is simultaneously doped in the first region, the second region, the third region, and the fourth region.

In an embodiment, d1, d2, d3, and d4 respectively represent values that are derived by subtracting respective n-type impurity concentrations (including a case where the concentration is zero) from respective p-type impurity concentrations (including a case where the concentration is zero) in the respective channel regions in the first P-type TFT, the second P-type TFT, the first N-type TFT, and the second N-type TFT.

A manufacturing method of another display device according to the present invention is a manufacturing method of a display device that includes the above-mentioned manufacturing method.

Effects of the Invention

According to the present invention, it becomes possible to provide a semiconductor device or a display device that has a plurality of TFTs having characteristics suited for various uses formed on a single TFT substrate with high manufacturing efficiency. Further, it becomes possible to provide a low power consumption semiconductor device or a display device that has a TFT substrate having various types of TFTs formed thereon with high manufacturing efficiency.

BRIEF DESCRIPTION OF THE DRAWINGS

FIGS. 12(a) to 12(e) are tables for explaining five treatment methods of the semiconductor layers 20a to 20d in the semiconductor device 101.

FIGS. 15(a) and 15(b) are tables for explaining two treatment methods of the semiconductor layers 20a to 20d in the semiconductor device 102.

DETAILED DESCRIPTION OF EMBODIMENTS

Embodiment 1

A semiconductor device 100 according to Embodiment 1 of the present invention will be described below with reference to figures. The scope of the present invention is not limited to the embodiments below.

Figure 1:
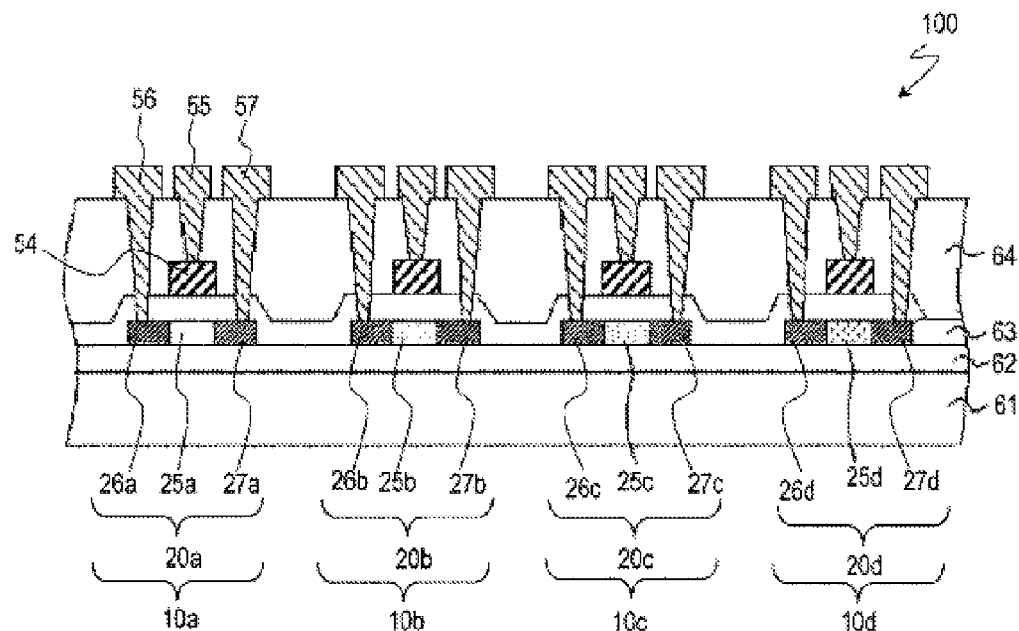
FIG. 1 is a schematic cross-sectional view showing a configuration of a semiconductor device 100 according to Embodiment 1 of the present invention.
Figure 2:
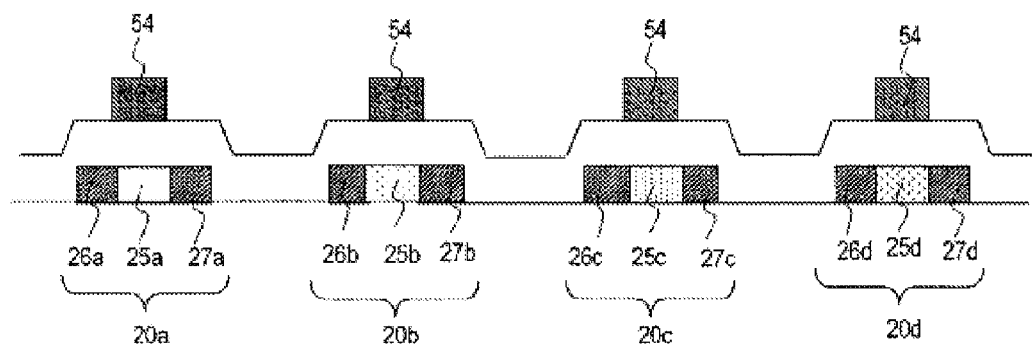
FIG. 2 is a schematic cross-sectional view showing a configuration of the semiconductor device 100 near semiconductor layers 20a to 20d.

FIG. 1 is a schematic cross-sectional view showing a configuration of the semiconductor device 100 according to Embodiment 1 of the present invention. FIG. 2 is a schematic cross-sectional view showing a configuration of the semiconductor device 100 near semiconductor layers 20a to 20d.

As shown in FIGS. 1 and 2, the semiconductor device 100 has stagger-type TFTs 10a, 10b, 10c, and 10d that have a top gate structure. The TFTs 10a and 10b are P-type TFTs (p-channel type TFTs), and the TFTs 10c and 10d are N-type TFTs (n-channel type TFTs). The TFT 10a and the TFT 10d are used as high-voltage driven TFTs, which are applied with a relatively high voltage between a source and a drain. The TFT 10b and the TFT 10c are used as low-voltage driven TFTs, which are applied with a lower voltage than that of the high-voltage driven TFTs between a source and a drain.

The TFTs 10a, 10b, 10c, and 10d (these may be abbreviated to "10a to 10d" below. Other reference characters may be abbreviated in the same manner) may be referred to as a first P-type TFT, a second P-type TFT, a first N-type TFT, and a second N-type TFT, respectively. FIGS. 1 and 2 show only four TFTs that are provided in the semiconductor device 100. However, the semiconductor device 100 is provided with at least four types of TFTs 10a to 10d, and the semiconductor device 100 may be further provided with the same or different types of TFTs.

The semiconductor device 100 is provided with a substrate (a transparent substrate, an insulating substrate, or the like) 61 made of glass, an insulating resin, or the like and an under coat layer 62 deposited on the substrate 61. The TFTs 10a to 10d have the semiconductor layers 20a, 20b, 20c, and 20d, respectively, that are made of polycrystalline silicon (polysilicon), formed on the under coat layer 62. The semiconductor layers 20a to 20d may be made of non-single-crystal and non-amorphous silicon such as microcrystalline silicon. The semiconductor device 100 may have a configuration in which the under coat layer 62 is not provided.

On the semiconductor layers 20a to 20d, a gate insulating layer (gate insulating film) 63 and an insulating layer (interlayer insulating film) 64 are laminated. On the gate insulating layer 63, a plurality of gates 54 that correspond to the respective TFTs 10a to 10d are formed. On the insulating layer 64, gate electrodes 55, source electrodes 56, and drain electrodes 57 are respectively formed.

The respective semiconductor layers 20a to 20d are formed of source contact regions (first contact regions) 26a, 26b, 26c, and 26d, drain contact regions (second contact regions) 27a, 27b, 27c, and 27d, and channel regions 25a, 25b, 25c, and 25d that are respectively disposed between both of the corresponding contact regions. The source contact regions 26a to 26d are connected to the corresponding source electrodes 56, respectively, via contact holes in the gate insulating layer 63 and the insulating layer 64. The drain contact regions 27a to 27d are connected to the corresponding drain electrodes 57, respectively, via contact holes in the gate insulating layer 63 and the insulating layer 64. The respective gates 54 are connected to the corresponding gate electrodes 55 via contact holes in the insulating layer 64.

The channel regions 25b, 25c, and 25d are doped with a p-type impurity such as B (boron). The channel region 25a is not doped with an impurity. Concentrations of the impurity doped in the respective channel regions 25b to 25d differ from each other. When d1, d2, d3, and d4 respectively represent the p-type impurity concentrations in the respective channel regions 25a to 25d (including a case where the concentration is zero), d1, d2, d3, and d4 satisfy a relation of d1<d2<d3<d4.

Figure 3:
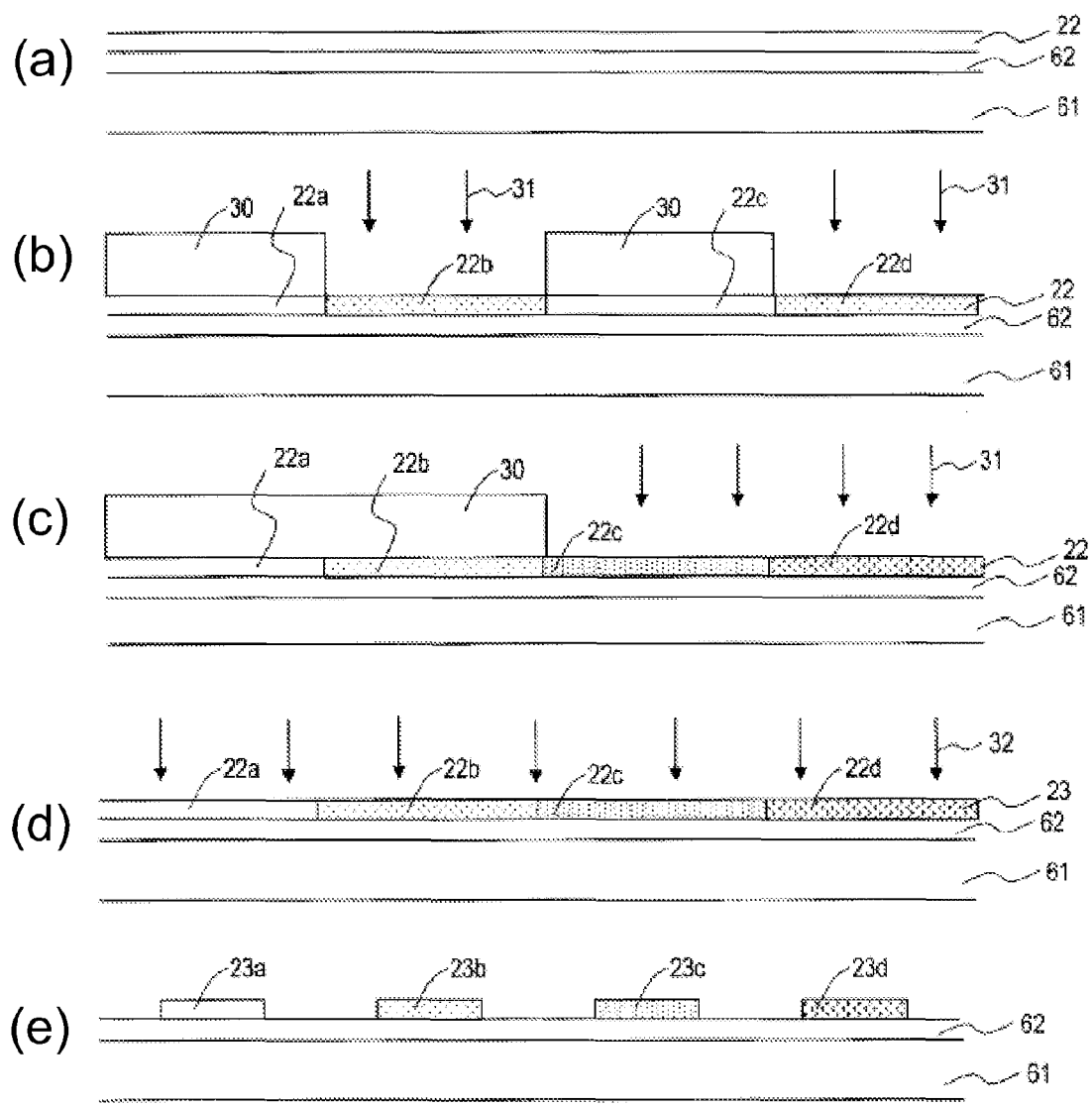
FIGS. 3(a) to 3(e) are schematic cross-sectional views showing a method of manufacturing the semiconductor device 100.
Figure 4:
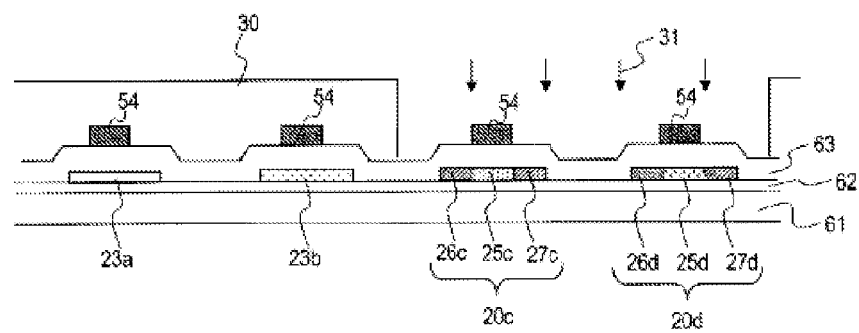
FIGS. 4(a) and 4(b) are schematic cross-sectional views showing the method of manufacturing the semiconductor device 100.
Figure 5:
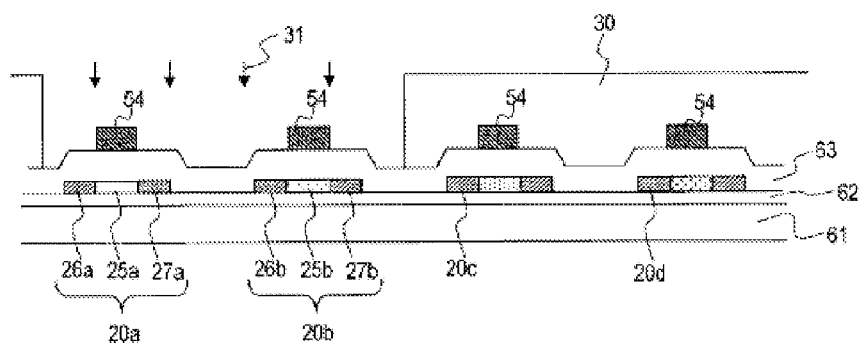
FIGS. 5(a) to 5(c) are tables for explaining three treatment methods of the semiconductor layers 20a to 20d.

Next, a method of manufacturing the semiconductor device 100 will be described with reference to FIGS. 3, 4, and 5.

First, on the substrate 61, a layer of a silicon oxide film ($SiO_x$), a silicon nitride film ($SiN_x$), or the like is formed with a thickness of about 300 nm by the PCVD (plasma CVD) method, the LPCVD (low-pressure CVD) method, sputtering, or the like, thereby forming the under coat layer 62. The under coat layer 62 is formed in order to prevent impurities from diffusing from the substrate 61 to the semiconductor layers 20a to 20d. However, if the impurity diffusion does not cause a problem, the under coat layer 62 may not be formed. Next, on the under coat layer 62, amorphous silicon (a-Si) is formed with a thickness of about 20 to 100 nm by the PCVD method, the LPCDV method, sputtering, or the like, thereby forming an amorphous silicon layer (a-Si) layer 22 and achieving a multilayer structure shown in FIG. 3(a). In case of forming the a-Si layer 22 by the PCVD method, a dehydrogenation treatment is performed after the a-Si layer 22 is formed.

Next, as shown in FIG. 3(b), a resist 30 is formed on the a-Si layer 22, and openings of the resist 30 are formed on regions 22b and 22d in the a-Si layer 22 by photolithography. Regions 22a (first region), 22b (second region), 22c (third region), and 22d (fourth region) in the a-Si layer 22 are regions where the semiconductor layers 20a, 20b, 20c, and 20d shown in FIGS. 1 and 2 are respectively formed. Thereafter, in the regions 22b and 22d, a dopant 31, which is the p-type impurity (B in the present embodiment), is selectively doped by the ion implantation method or the like (first doping step (first step)).

Next, after the resist 30 is removed, the resist 30 is formed again on the a-Si layer 22 as shown in FIG. 3(c), and the openings of the resist 30 are formed on the regions 22c and 22d in the a-Si layer 22 by photolithography. Thereafter, in the regions 22c and 22d, the dopant 31, which is B, is selectively doped by the ion implantation method or the like (second doping step (second step)).

Next, after the resist 30 is removed, all of the regions 22a to 22d in the semiconductor layer 22 are annealed with laser light 32 such as excimer laser as shown in FIG. 3(d), thereby making the semiconductor layer 22 a polysilicon layer 23. For the laser light 32, pulsed laser, CW (Continuous Wave) laser, or the like can be used. Thereafter, part of the polysilicon layer 23 is removed by photolithography, thereby forming polysilicon regions 23a to 23d.

Next, a silicon oxide film is formed with a thickness of about 30 to 200 nm so as to cover the polysilicon regions 23a to 23d by the PCVD method, the LPCVD method, sputtering, or the like, thereby forming the gate insulating layer 63. Next, on the gate insulating layer 63, aluminum (Al) is deposited in a thickness of about 100 to 500 nm by sputtering. Thereafter, the aluminum is patterned by photolithography and wet etching, the photoresist is removed, and the substrate is washed, thereby forming the plurality of gates 54 as shown in FIG. 4(a).

Metal for the gates 54 is not limited to aluminum. The gates 54 may be made of a single metal such as tantalum (Ta), titanium (Ti), indium tin oxide (ITO), tungsten (W), copper (Cu), chrome (Cr), and molybdenum (Mo), or a material obtained by adding nitrogen, oxygen, or other metals to these metals, for example. In forming the gates 54, the PCVD method or the like can be employed instead of sputtering. Further, dry etching may be employed instead of wet etching.

Next, as shown in FIG. 4(a), a resist is formed so as to selectively cover the polysilicon regions 23a and 23b from above (in a region where the TFTs 10a and 10b are to be formed), and the dopant 31, which is P (phosphorus), is doped in the polysilicon regions 23c and 23d using the gates 54 that are placed above the polysilicon regions as masks. This way, the polysilicon regions 23c and 23d are doped with P except for the regions under the respective gates 54, thereby forming the source contact regions 26c and 26d and the drain contact regions 27c and 27d of the TFTs 10c and 10d, which are the N-type TFTs, respectively. The regions in the polysilicon regions 23c and 23d that were covered by the gates 54 at that time are not doped with P, thereby forming the channel regions 25c and 25d of the TFTs 10c and 10d, respectively. This way, the semiconductor layers 20c and 20d of the TFTs 10c and 10d, respectively, are completed.

Next, as shown in FIG. 4(b), a resist is formed so as to selectively cover the semiconductor layers 20c and 20d from above (in a region where the TFTs 10c and 10d are formed), and the dopant 31, which is B, is doped in the polysilicon regions 23a and 23b using the gates 54 that are placed above the respective polysilicon regions as masks. This way, the polysilicon regions 23a and 23b are doped with B except for the regions under the respective gates 54, thereby forming the source contact regions 26a and 26b and the drain contact regions 27a and 27b of the TFTs 10a and 10b, which are the P-type TFTs, respectively. The regions in the polysilicon regions 23a and 23b that were covered by the gates 54 at that time are not doped with B, thereby forming the channel regions 25a and 25b of the TFTs 10a and 10b, respectively. This way, the semiconductor layers 20a and 20b of the TFTs 10a and 10b, respectively, are completed. Here, the steps of forming the semiconductor layers 20a and 20b may be performed before the steps of forming the semiconductor layers 20c and 20d.

Next, after the insulating layer 64 is formed by removing resist 30 and then by forming a layer of silicon oxide, silicon nitride, or the like, the contact holes are formed in the gate insulating layer 63 and the insulating layer 64 on the source contact layers 26a to 26d and the drain contact layers 27a to 27d, and in the insulating layer 64 on the respective gates 54. Thereafter, a metal material such as aluminum is deposited on the insulating layer 64 so as to fill in the contact holes, and the gate electrodes 55, the source electrodes 56, and the drain electrodes 57 are formed on the respective TFTs by photolithography. By the processes described above, the semiconductor device 100 shown in FIG. 1 is completed.

Doping amounts of B in the doping steps that are performed twice, which were described with reference to FIGS. 3(b) and 3(c), and other examples of doping steps that correspond thereto will be described with reference to FIG. 5.

FIG. 5(a) shows a relationship among the doping amounts (D) of B in the regions 22a to 22d in the doping steps that are performed twice (a first doping example). As shown in FIG. 5(a), in the first doping, an amount "a" of B is doped in the regions 22b and 22d. In the second doping, an amount "b" of B, which is greater than the amount "a," is doped in the regions 22c and 22d. As a result, the total doses in the regions 22a to 22d result in 0, a, b (>a), and a+b, respectively. These amounts are reflected on the impurity concentrations of B in the respective channel regions 25a to 25d in the TFTs 10a to 10d shown in FIGS. 1 and 2. The impurity concentrations d1, d2, d3, and d4 of the respective channel regions 25a to 25d satisfy a relation of d1<d2<d3<d4.

FIG. 5(b) shows a relationship among doses (D) in the respective regions 22a to 22d in a second doping example of the present embodiment. As shown in FIG. 5(b), the doping steps are performed twice also in the second doping example. In the first doping, an amount "a" of B is doped in the regions 22c and 22d, and in the second doping, an amount "b" (>a) of B is doped in the regions 22b and 22d. As a result, the total doses in the regions 22a to 22d result in 0, b (>a), a, and a+b, respectively. Therefore, the impurity concentrations d1, d2, d3, and d4 of the respective channel regions 25a to 25d satisfy a relation of d1<d3<d2<d4.

FIG. 5(c) shows a relationship among the doses (D) in the regions 22a to 22d in a third doping example of the present embodiment. As shown in FIG. 5(c), in the third doping example, the doping steps are performed three times. The third doping step is performed between the second doping step shown in FIG. 3(c) and the annealing step shown in FIG. 3(d), after forming the resist 30 again and forming the openings of the resist 30.

In the first doping, an amount "c" of B is doped in all of the regions 22a to 22d. In the second doping, an amount "a" (>c) of B is doped in the regions 22b and 22d. In the third doping, an amount "b" (>a) of B is doped in the regions 22c and 22d. As a result, the total doses in the regions 22a to 22d result in c, a+c, b+c (>a+c), and a+b+c, respectively. Therefore, the impurity concentrations d1, d2, d3, and d4 of the respective channel regions 25a to 25d satisfy a relation of d1<d2<d3<d4.

The above first to third doping examples serve solely as illustrations, and the doping in Embodiment 1 is not limited to the above examples. The respective values "a" in the first to third doping examples may differ from each other, and the respective values "b" in the first to third doping examples may differ from each other. However, d1, d2, d3, and d4 satisfy relations of d1<d2 and d3<d4 in the present embodiment.

In the present embodiment and in other embodiments that will be described later, impurity implantation in the polysilicon regions 23a to 23d are performed before the gate insulating layer 63 is formed. However, this impurity implantation can be performed after the gate insulating layer 63 is formed. In that case, the doses in the channel regions 25a to 25d are set to 5e11 to 2e12 (atoms/cm$^2$), 1e12 to 2.5e12 (atoms/cm$^2$), 1.5e12 to 3e12 (atoms/cm$^2$), and 2e12 to 4e12 (atoms/cm$^2$), respectively, where acceleration energy (implantation energy) is set to 25 keV, for example. In contrast, in a conventional semiconductor device, the entire substrate is doped with a dose of 1e12 (atoms/cm$^2$), and the dose in CD dope is set to 2e12 (atoms/cm$^2$), which amount to a total of 3e12 (atoms/cm$^2$).

For the dopant, instead of the p-type impurities such as B, the n-type impurities such as P (phosphorus) may be used. For the dopant in the second doping in the first doping example, P may be used, for example. In this case, d1, d2, d3, and d4 respectively represent values that are derived by subtracting the respective n-type impurity concentrations (including a case where the concentration is zero) from the respective p-type impurity concentrations (including a case where the concentration is zero) in the channel regions 25a to 25d. The channel region 25a in the TFT 10a was not doped with any impurity in the description above, but the channel region 25a may be doped with the p-type impurity and n-type impurity of the same amount such that d1 becomes zero. In any case, in the present embodiment, the relations of d1<d2 and d3<d4 are satisfied.

Figure 6:
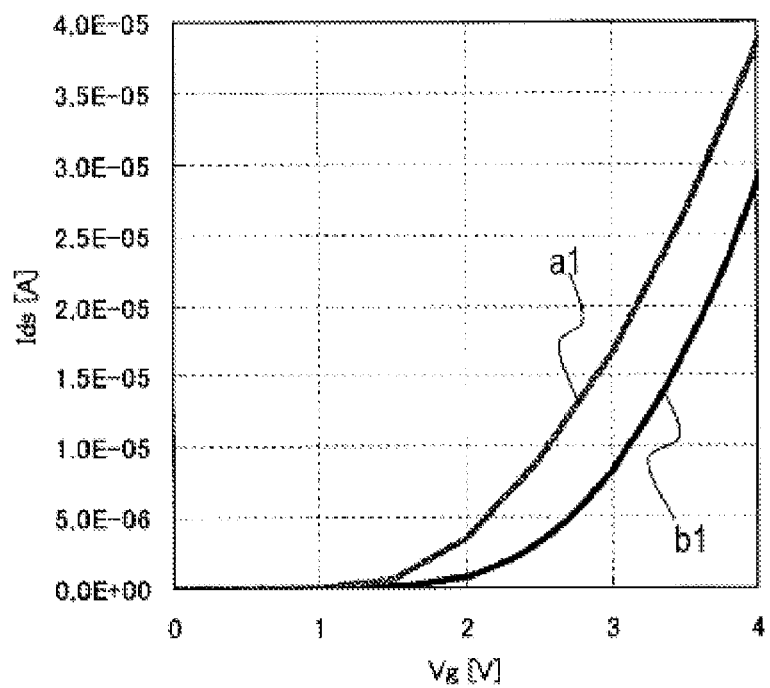
FIGS. 6(a) and 6(b) are graphs for explaining an effect of the semiconductor device 100.
Figure 6:
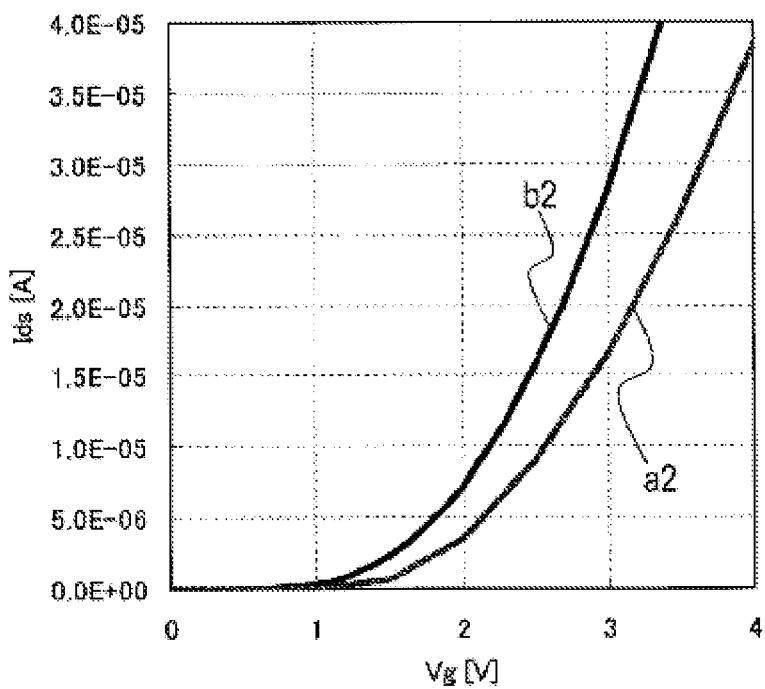

FIG. 6 is a graph for explaining an effect of the semiconductor device 100. FIG. 6(a) shows voltage dependence (Id-Vg characteristics) of the mobility of a high voltage TFT and a low voltage TFT. In the respective TFTs, the channel regions thereof have the same impurity concentration. In FIG. 6(a), a1 shows a characteristic of the high voltage TFT, and b1 shows a characteristic of the low voltage TFT, respectively. FIG. 6(b) shows the respective Id-Vg characteristics of the high voltage TFT, which has the channel region having a high impurity concentration, and of the low voltage TFT, which has the channel region having a lower impurity concentration than that of the high voltage TFT. In FIG. 6(b), a2 shows a characteristic of the high voltage TFT, and b2 shows a characteristic of the low voltage TFT.

As it is apparent from the comparison between FIGS. 6(a) and 6(b), when the impurity concentration is the same, a threshold voltage of the low voltage TFT becomes higher than that of the high voltage TFT. However, as in the high voltage TFT 10d and the low voltage TFT 10c in the present embodiment, when the impurity concentration of the high voltage TFT is higher than that of the low voltage TFT, it becomes possible to keep the threshold voltage of the low voltage TFT lower than that of the high voltage TFT. Therefore, when the TFT 10c is used as a switching TFT for a peripheral circuit in the display device, for example, it becomes possible to reduce a leak current, thereby suppressing power consumption of the device.

The example shown with reference to FIG. 6 illustrates one of the advantages of the semiconductor device of the present embodiment. By appropriately changing the impurity concentrations in the respective channel regions in the TFTs 10a to 10d according to the respective circuits, it becomes possible to provide a high performance and low power consumption semiconductor device with high manufacturing efficiency.

According to the present embodiment, it is possible to make the respective impurity concentrations in the channel regions different from each other among at least four types of the TFTs that are formed on the same substrate. Therefore, the threshold voltage of the respective TFTs can be appropriately set for the respective circuits for which the respective TFTs are used, such as keeping the threshold voltage of the low voltage TFT lower than that of the high voltage TFT, for example. This makes it possible to achieve various types of control over a semiconductor device or a device that has a semiconductor device without increasing power consumption more than necessary.

Further, if a doping step using an ion doping device is performed separately for each of the four types of TFTs so as to make the respective impurity concentrations thereof differ from each other, it would be necessary to perform at least three photolithography steps and four doping steps. However, according to the present embodiment, only two photolithography steps and only two or three doping steps are required. This can improve efficiency in manufacturing a semiconductor device provided with various types of TFTs.

Next, a display device 200 according to the present embodiment of the present invention will be described with reference to FIGS. 7 to 9. The display device 200 will be described as a liquid crystal display device. However, the display device 200 of the present invention is not limited to the liquid crystal display device. The display device 200 may be other types of display devices such as an organic electroluminescence (EL) display device and an inorganic electroluminescence display device that are respectively provided with an active matrix substrate having a plurality of TFTs.

Figure 7:
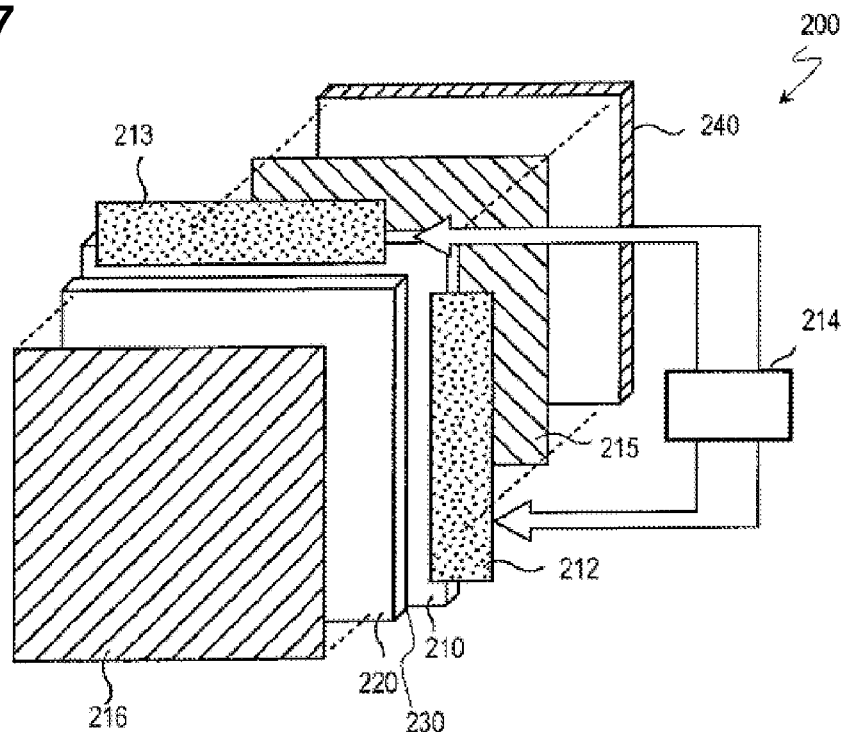
FIG. 7 is a schematic perspective view showing a configuration of a display device 200 according to an embodiment of the present invention.

FIG. 7 is a schematic perspective view showing a configuration of the display device 200. FIG. 8 is a schematic plan view showing a configuration of a TFT substrate 210 in a display region 260 in the display device 200. FIG. 9 is a schematic plan view showing an entire configuration of the TFT substrate 210 in the display device 200.

As shown in FIG. 7, the display device 200 is provided with the TFT substrate 210 and an opposite substrate (CF substrate) 220 that are disposed so as to face each other sandwiching a liquid crystal layer 230 therebetween, polarizing plates 215 and 216 that are disposed on respective outer sides of the TFT substrate 210 and the opposite substrate 220, and a backlight unit 240 that emits light for display to the polarizing plate 215.

Figure 8:
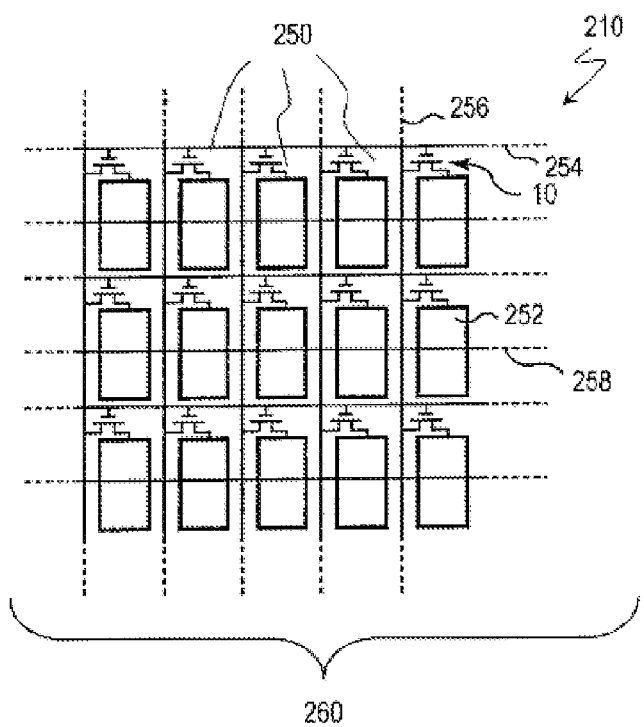
FIG. 8 is a schematic plan view showing a configuration of a TFT substrate 210 in a display region 260 in the display device 200.

As shown in FIG. 8, the display region 260 in the display device 200 has a plurality of pixels 250 disposed in a matrix. In the TFT substrate 210, a plurality of scan lines (gate bus lines) 254 and a plurality of signal lines (data bus lines) 256 are extended so as to be orthogonal to each other. TFTs 10 of the present invention are disposed in the respective pixels 250 as active elements near respective intersections of the plurality of scan lines 254 and the plurality of signal lines 256. Here, one pixel is defined as a region divided by the two adjacent scan lines 254 and the two adjacent signal lines 256. On the respective pixels 250, pixel electrodes 252 made of ITO (Indium Tin Oxide), for example, which are electrically connected to the drain electrodes 57 of the TFTs 10, are disposed, respectively. Auxiliary capacitance lines (storage capacitance lines; also referred to as Cs lines) 258 may extend between the two adjacent scan lines 254 in parallel with the scan lines 254.

The plurality of scan lines 254 and the plurality of signal lines 256 are connected to a gate driver (scan line driver circuit) 212 and a data driver (signal line driver circuit) 213, respectively, which are shown in FIG. 7. Signals from the gate driver 212 and the data driver 213 are controlled by a display controller 214, and according to this control, scan signals that switch ON and OFF of the TFTs 10 are supplied from the gate driver 212 to the plurality of scan lines 254. Further, according to the control by the display controller 214, display signals (voltage applied to the pixel electrodes 252) are supplied from the data driver 213 to the plurality of signal lines 256.

The opposite substrate 220 shown in FIG. 7 is provided with color filters and a common electrode. In case of employing three primary-color display, the color filters have R (red) filters, G (green) filters, and B (blue) filters, each of which is placed corresponding to a pixel. The common electrode is formed so as to cover the plurality of pixel electrodes 252. Liquid crystal molecules disposed between the common electrode and the respective pixel electrodes 252 are oriented at the respective pixels 250 based on a potential difference generated between the two electrodes, and an image is thereby displayed.

Figure 9:
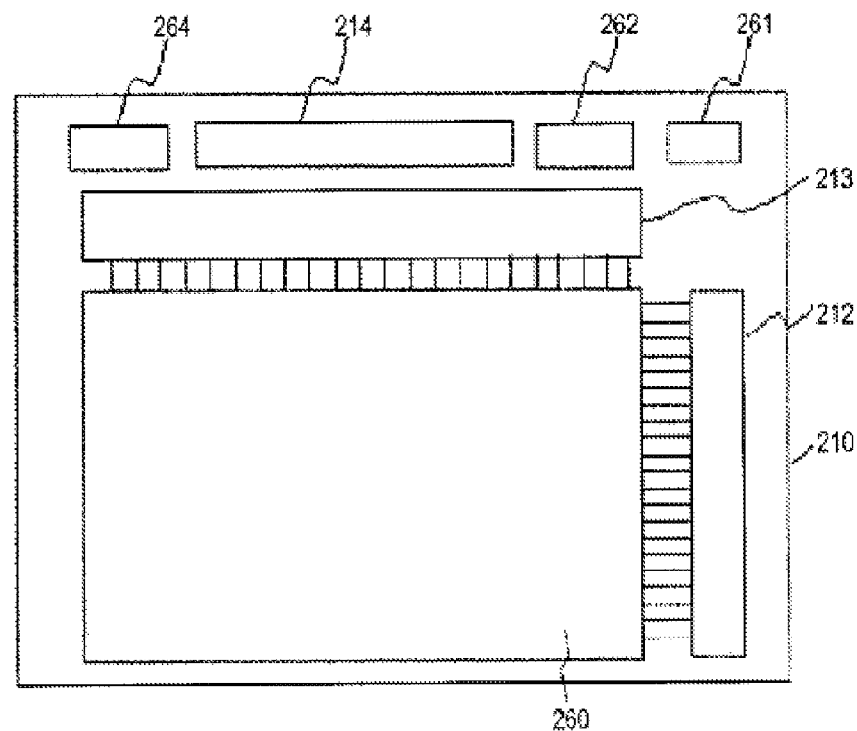
FIG. 9 is a schematic plan view showing an entire configuration of the TFT substrate 210 in the display device 200.

As shown in FIG. 9, on the TFT substrate 210, a power circuit 261, a memory 262, a common driver 264, and the like are formed in addition to the display region 260, the gate driver 212, the data driver 213, and the display controller 214 described above. The TFTs 10a to 10d of the present embodiment are used for TFTs for the display region 260, the gate driver 212, the data driver 213, the display controller 214, the power circuit 261, the memory 262, the common driver 264, and the like.

When the low voltage TFT 10c is used for the peripheral circuits such as the gate driver 212, the data driver 213, and the display controller 214, for example, the threshold voltage can be kept low. Therefore, it becomes possible to speed up operation of the peripheral circuits and to reduce the leak current or the power consumption. As a result, it becomes possible to provide a high-definition, high-quality, and low power consumption display device with high manufacturing efficiency.

Embodiment 2

Next, a semiconductor device 101 according to Embodiment 2 of the present invention will be described with reference to FIGS. 10 to 12.

The semiconductor device 101 is provided with the four types of the TFTs 10a to 10d in the same manner as Embodiment 1, and an entire configuration thereof is almost the same as the device shown in FIG. 1. Therefore, the semiconductor device 101 is not shown in figures. Below, configurations that are different from Embodiment 1 will be mainly described. Except for configurations, functions, effects, and the like that will be particularly described below, those of the semiconductor device 101 are the same as those described in Embodiment 1. The semiconductor device 101 and the four types of the TFTs 10a to 10d of the present embodiment can also be applied to the display device 200 described in Embodiment 1.

Figure 10:
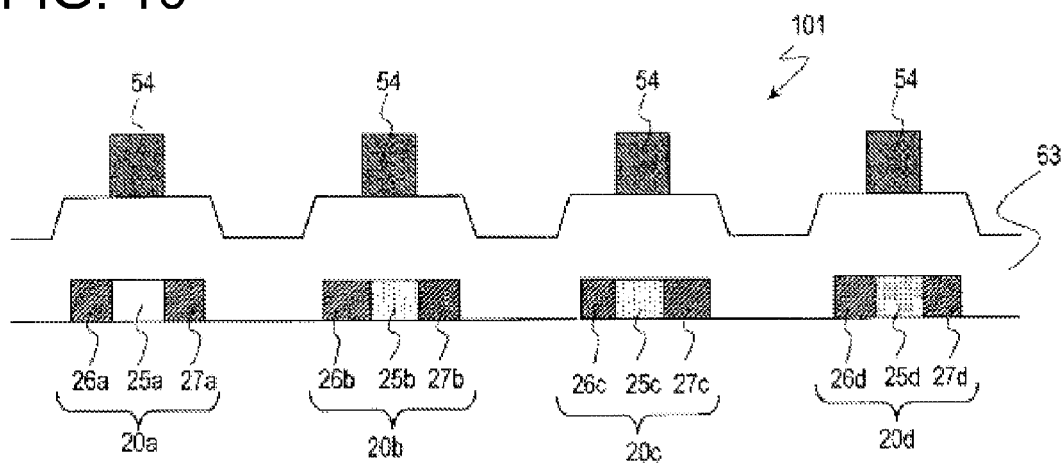
FIG. 10 is a schematic cross-sectional view showing a configuration of a semiconductor device 101 near semiconductor layers 20a to 20d according to Embodiment 2 of the present invention.
Figure 11:
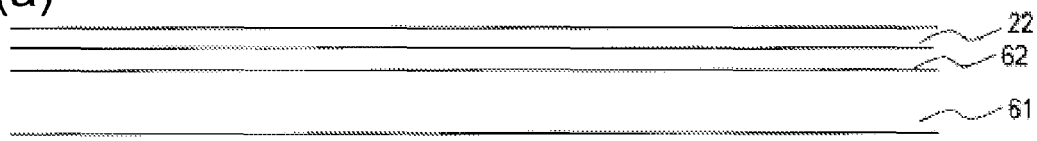
FIGS. 11(a) to 11(e) are schematic cross-sectional views showing a method of manufacturing the semiconductor device 101.
Figure 11:
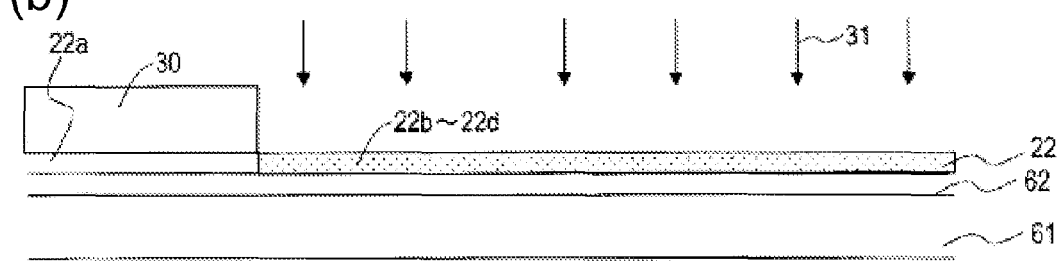
Figure 11:
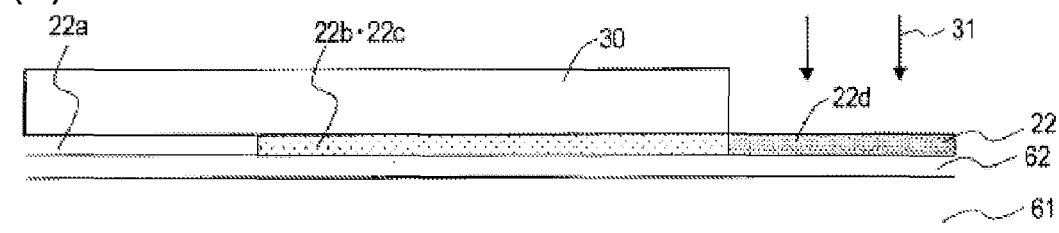
Figure 11:
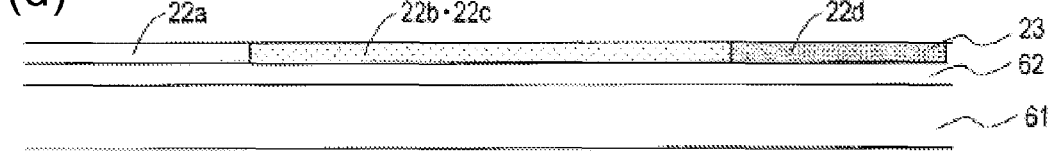
Figure 11:
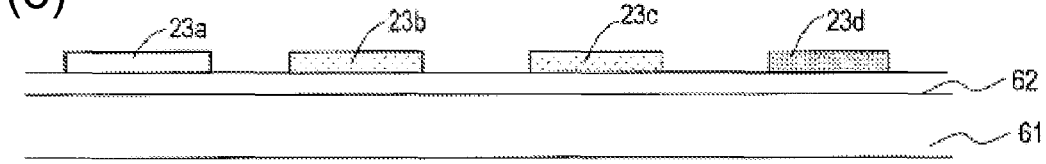

FIG. 10 is a schematic cross-sectional view showing a configuration of the semiconductor device 101 near the semiconductor layers 20a to 20d.

As shown in FIG. 10, the semiconductor layers 20a to 20d of the four types of the TFTs 10a to 10d in the semiconductor device 101 are formed of the source contact regions 26a to 26d, the drain contact regions 27a to 27d, and the channel regions 25a to 25d, respectively. The channel regions 25b, 25c, and 25d are doped with a p-type impurity such as B, and the channel region 25a is not doped with impurities. When d1, d2, d3, and d4 respectively represent p-type impurity concentrations in the channel regions 25a to 25d (including a case where the concentration is zero), d1, d2, d3, and d4 satisfy a relation of d1<d2=d3<d4.

Next, a method of manufacturing the semiconductor device 101 will be described with reference to FIGS. 11 and 12. The latter part of the method of manufacturing the semiconductor device 101 is the same as that of the semiconductor device 100 in Embodiment 1 described above with reference to FIG. 4, and therefore, the description thereof will not be repeated.

First, as described above with reference to FIG. 3(a), the under coat layer 62 is formed on the substrate 61. Next, the amorphous silicon layer 22 is laminated on the under coat layer 62, thereby forming a multilayer structure shown in FIG. 11(a).

Next, as shown in FIG. 11(b), the resist 30 is formed on the a-Si layer 22, and an opening of the resist 30 is formed on the regions 22b to 22d (the second to fourth regions) by photolithography. Thereafter, B is doped in the regions 22b to 22d (first doping step (first step)).

Next, after the resist 30 is removed, the resist 30 is formed again on the a-Si layer 22 as shown in FIG. 11(c). Thereafter, an opening is formed on the region 22d, and B is doped in the region 22d (second doping step (second step)).

Next, after the resist 30 is removed, the regions 22a to 22d are annealed with laser, thereby forming the polysilicon layer 23 as shown in FIG. 11(d). Thereafter, part of the polysilicon layer 23 is removed by photolithography, thereby forming the polysilicon regions 23a to 23d as shown in FIG. 11(e). Lastly, the steps described above with reference to FIGS. 4(a) and 4(b) are performed, and the semiconductor device 101 is completed.

FIG. 12 is a table for explaining five methods of performing a doping process when forming the semiconductor layers 20a to 20d of the semiconductor device 101.

FIG. 12(a) shows a relationship among doping amounts (D) of B in the respective regions 22a to 22d in the doping steps that are performed twice (first doping example) in the method of manufacturing the semiconductor device 101. As shown in FIG. 12(a), in the first doping, an amount "a" of B is doped in the regions 22b to 22d. In the second doping, an amount "b" of B, which is greater than the amount "a," is doped in the region 22d. As a result, the total doses in the regions 22a to 22d result in 0, a, a, and a+b, respectively. The impurity concentrations d1, d2, d3, and d4 of the respective channel regions 25a to 25d satisfy a relation of d1<d2=d3<d4.

FIG. 12(b) shows a relationship among the doses (D) in a second doping example in the present embodiment. As shown in FIG. 12(b), in the first doping, an amount "a" of B is doped in the region 22d. In the second doping, an amount "b" (>a) of B is doped in the regions 22b to 22d. As a result, the total doses in the regions 22a to 22d result in 0, b, b, and a+b, respectively, and the impurity concentrations d1, d2, d3, and d4 satisfy a relation of d1<d2=d3<d4.

FIG. 12(c) shows a relationship among the doses (D) in a third doping example of the present embodiment. As shown in FIG. 12(c), in the first doping, an amount "a" of B is doped in the regions 22a, 22c, and 22d. In the second doping, an amount "b" (>a) of B is doped in the regions 22b and 22d. As a result, the doses in the regions 22a to 22d result in a, b, a, and a+b, respectively, and the impurity concentrations d1, d2, d3, and d4 satisfy relations of d1<d2 and d3<d4.

FIG. 12(d) shows a relationship among the doses (D) in a fourth doping example of the present embodiment. As shown in FIG. 12(d), in the first doping, an amount "a" of B is doped in the regions 22a and 22d. In the second doping, an amount "b" (>a) of B is doped in the regions 22b to 22d. As a result, the total doses in the regions 22a to 22d result in a, b, b, and a+b, respectively, and the impurity concentrations d1, d2, d3, and d4 satisfy a relation of d1<d2=d3<d4.

FIG. 12(e) shows a relationship among the doses (D) in a fifth doping example of the present embodiment. As shown in FIG. 12(e), in the fifth doping example, the doping is performed three times (third step).

In the first doping, an amount "c" of B is doped in all of the regions 22a to 22d. In the second doping, an amount "a" of B is doped in the regions 22b to 22d. In the third doping, an amount "b" (>a) of B is doped in the region 22d. As a result, the doses in the regions 22a to 22d result in c, a+c, a+c, and a+b+c, respectively. Therefore, the impurity concentrations d1, d2, d3, and d4 in the respective channel regions 25a to 25d satisfy a relation of d1<d2=d3<d4.

The third doping step is performed between the second doping step shown in FIG. 11(c) and the annealing step, after forming the resist 30 again, and forming the openings of the resist 30. The third step may be performed before the first step, or between the first step and the second step. The same step as the third step may be added to the first to fourth doping examples described above.

The above first to fifth doping examples serve solely as illustrations, and therefore, the doping in Embodiment 2 is not limited to such examples. The respective values "a" in the first to fifth doping examples may differ from each other, and the respective values "b" in the first to fifth doping examples may differ from each other. However, d1, d2, d3, and d4 satisfy relations of d1<d2 and d3<d4 in the present embodiment.

In the same manner as Embodiment 1, for the dopant, the n-type impurities may be used instead of the p-type impurities. In that case, d1, d2, d3, and d4 represent values that are derived by subtracting the respective n-type impurity concentrations (including a case where the concentration is zero) from the respective p-type impurity concentrations (including a case where the concentration is zero) in the channel regions 25a to 25d.

According to the present embodiment, it is possible to make the respective impurity concentrations different from each other among at least three channel regions out of at least four types of the TFTs that are formed on the same substrate. Therefore, the characteristics of the respective TFTs can be appropriately set for the respective circuits for which the respective TFTs are used, such as keeping the threshold voltage of the low voltage TFT lower than that of the high voltage TFT, for example. This makes it possible to perform various types of control of a semiconductor device or a device that has a semiconductor device without increasing power consumption more than necessary. Further, according to the present embodiment, only two photolithography steps and only two or three doping steps are required. This can improve efficiency in manufacturing a semiconductor device provided with various TFTs.

Embodiment 3

Next, a semiconductor device 102 according to Embodiment 3 of the present invention will be described with reference to FIGS. 13 to 15.

The semiconductor device 102 is provided with the four types of the TFTs 10a to 10d in the same manner as Embodiment 1, and an entire configuration thereof is almost the same as the device shown in FIG. 1. Therefore, the semiconductor device 102 will not be shown in figures. Below, configurations that are different from Embodiment 1 will be mainly described. Except for configurations, functions, effects, and the like that will be particularly described below, those of the semiconductor device 102 are the same as those described in Embodiment 1. The semiconductor device 102 and the four types of the TFTs 10a to 10d of the present embodiment can also be applied to the display device 200 described in Embodiment 1.

Figure 13:
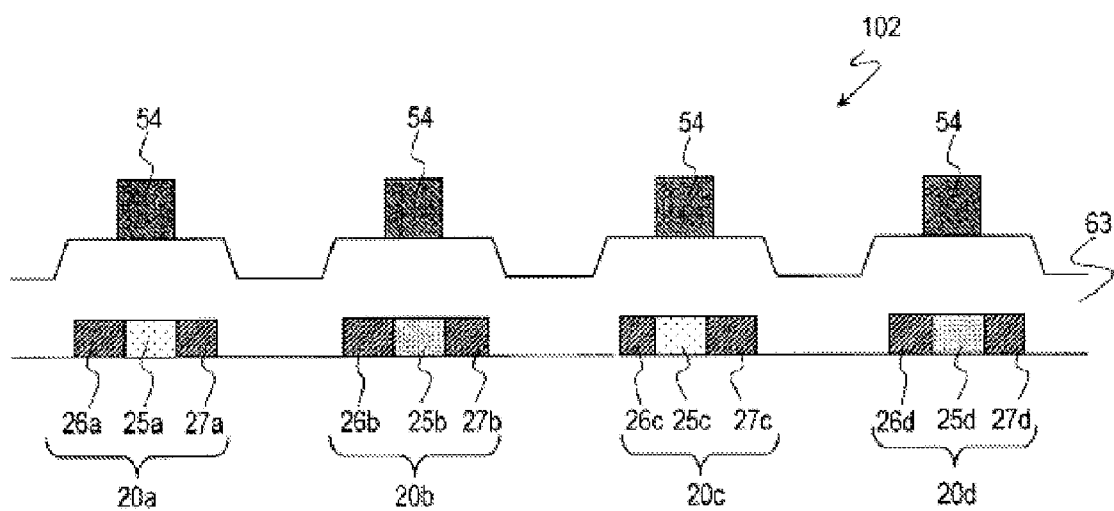
FIG. 13 is a schematic cross-sectional view showing a configuration of a semiconductor device 102 near semiconductor layers 20a to 20d according to Embodiment 3 of the present invention.
Figure 14:
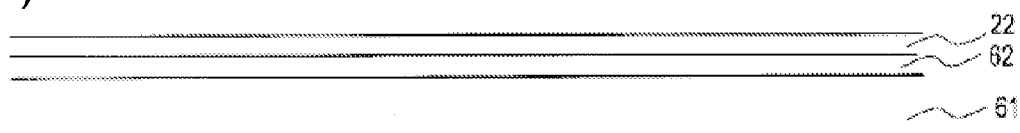
FIGS. 14(a) to 14(e) are schematic cross-sectional views showing a method of manufacturing the semiconductor device 102.
Figure 14:
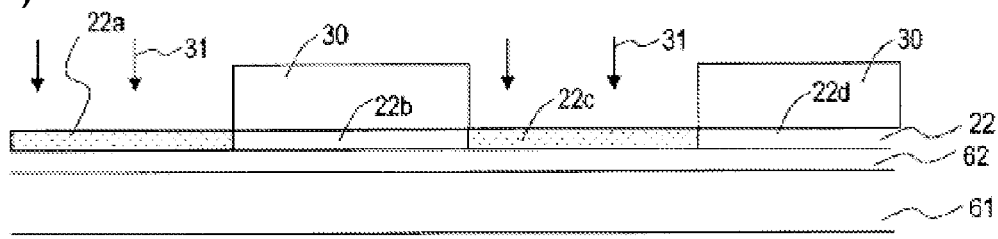
Figure 14:
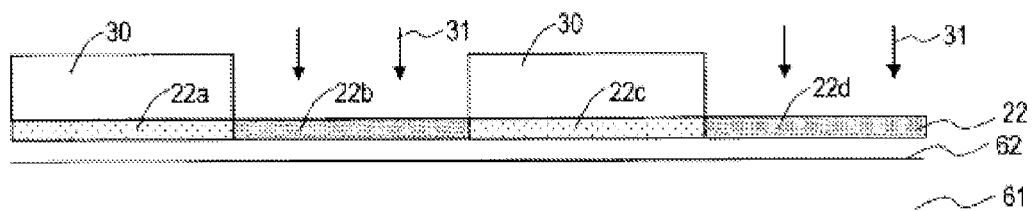
Figure 14:
Figure 14:
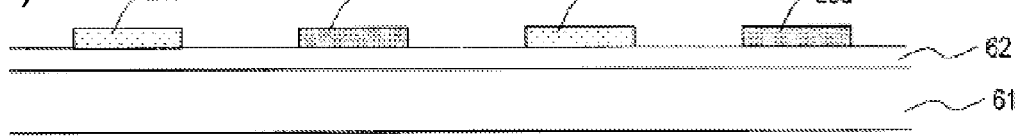

FIG. 13 is a schematic cross-sectional view showing a configuration of the semiconductor device 102 near the semiconductor layers 20a to 20d.

As shown in FIG. 13, the semiconductor layers 20a to 20d in the four types of the TFT10a to 10d of the semiconductor device 102 are formed of the source contact regions 26a to 26d, the drain contact regions 27a to 27d, and the channel regions 25a to 25d, respectively. The channel regions 25a to 25d are doped with a p-type impurity such as B. The respective doses in the channel regions 25a and 25c are the same, and the respective doses in the channel regions 25b and 25d are the same. When d1, d2, d3, and d4 respectively represent the p-type impurity concentrations in the channel regions 25a to 25d (including a case where the concentration is zero), d1, d2, d3, and d4 satisfy relations of d1<d2 and d3<d4. More specifically, d1, d2, d3, and d4 satisfy a relation of d1=d3<d2=d4. Further, d1, d2, d3, and d4 may satisfy a relation of d1=d3<d2, d1=d3<d4, d1<d2=d4, or d3<d2=d4.

Next, a method of manufacturing the semiconductor device 102 will be described with reference to FIGS. 14 and 15. The latter part of the method of manufacturing the semiconductor device 102 is the same as that of the semiconductor device 100 in Embodiment 1 described above with reference to FIG. 4, and therefore, the description thereof will not be repeated.

First, as described above with reference to FIG. 3(a), the under coat layer 62 is formed on the substrate 61. Next, the amorphous silicon layer 22 is formed on the under coat layer 62, thereby forming a multilayer structure shown in FIG. 14(a).

Next, as shown in FIG. 14(b), the resist 30 is formed on the a-Si layer 22, and openings of the resist 30 are formed on the regions 22a (the first region) and 22c (the third region) by photolithography. Thereafter, B is doped in the regions 22a and 22c (first doping step (first step)).

Next, after the resist 30 is removed, the resist 30 is formed again on the a-Si layer 22 as shown in FIG. 14(c). Thereafter, openings are formed on the regions 22b (the second region) and 22d (the fourth region), and B is doped in the regions 22b and 22d (second doping step (second step)).

Next, after the resist 30 is removed, the regions 22a to 22d are annealed with laser, thereby forming the polysilicon layer 23 as shown in FIG. 14(d). Thereafter, part of the polysilicon layer 23 is removed by photolithography, thereby forming the polysilicon regions 23a to 23d as shown in FIG. 14(e). Lastly, the steps described above with reference to FIGS. 4(a) and 4(b) are performed, and the semiconductor device 102 is completed.

FIG. 15 is a table for explaining two methods of performing a doping process when forming the semiconductor layers 20a to 20d of the semiconductor device 102.

FIG. 15(a) shows a relationship among doping amounts (D) of B in the respective regions 22a to 22d in the doping steps that are performed twice (first doping example) in the method of manufacturing the semiconductor device 102. As shown in FIG. 15(a), in the first doping, an amount "a" of B is doped in the regions 22a and 22c. In the second doping, an amount "b" of B, which is greater than the amount "a," is doped in the regions 22b and 22d. As a result, the total doses in the regions 22a to 22d result in a, b, a, and b, respectively. The impurity concentrations d1, d2, d3, and d4 of the respective channel regions 25a to 25d satisfy relations of d1<d2 and d3<d4.

FIG. 15(b) shows a relationship among doses (D) in the second doping example in the present embodiment. As shown in FIG. 15(b), in the first doping, an amount "c" of B is doped in the regions 22a to 22d. In the second doping, an amount "a" of B is doped in the regions 22b and 22d. As a result, the total doses in the regions 22a to 22d result in c, c+a, c, and c+a, respectively, and the impurity concentrations d1, d2, d3, and d4 satisfy relations of d1<d2 and d3<d4.

The above first and second doping examples serve solely as illustrations, and therefore, the doping in Embodiment 3 is not limited to such examples. The respective values "a" in the first and second doping examples may differ from each other. However, d1, d2, d3, and d4 satisfy a relation of d1=d3<d2=d4 in the present embodiment.

In the same manner as Embodiment 1, for the dopant, the n-type impurities may be used instead of the p-type impurities. In that case, d1, d2, d3, and d4 represent values that are derived by subtracting the respective n-type impurity concentrations (including a case where the concentration is zero) from the respective p-type impurity concentrations (including a case where the concentration is zero) in the channel regions 25a to 25d.

In any case, when the impurities are doped in the channel regions 25a to 25d (and the regions 22a to 22d in the manufacturing process), and when d1, d2, d3, and d4 respectively represent values that are derived by subtracting the respective n-type impurity concentrations (including a case where the concentration is zero) from the respective the p-type impurity concentrations (including a case where the concentration is zero), d1, d2, d3, and d4 satisfy a relation of d1=d3<d2=d4. Depending on a manufacturing method, d1, d2, d3, and d4 may satisfy a relation of d1=d3<d2, d1=d3<d4, d1<d2=d4, or d3<d2=d4. The method of manufacturing the display device 200 of the present invention includes the manufacturing method of the semiconductor device described above.

According to the present embodiment, it is possible to appropriately set the characteristics of TFTs for the respective circuits for which the respective TFTs formed on the same substrate are used, such as keeping the threshold voltage of the low voltage TFT lower than that of the high voltage TFT. This makes it possible to achieve various types of control of a semiconductor device or a device that has a semiconductor device without increasing power consumption more than necessary.

INDUSTRIAL APPLICABILITY

The present invention is suitably used for display devices such as a liquid crystal display device, an organic electroluminescence (EL) display device, and an inorganic electroluminescence display device that are respectively provided with an active matrix substrate having thin-film transistors, or various semiconductor devices.

DESCRIPTION OF REFERENCE CHARACTERS 10, 10a to 10d TFT
20a to 20d semiconductor layer
22 amorphous silicon layer (a-Si layer)
22a to 22d region (region in silicon layer)
23 polysilicon layer
23a to 23d polysilicon region
25a to 25d channel region
26a to 26d source contact region (first contact region)
27a to 27d drain contact region (second contact region)
54 gate (gate electrode)
30 resist
31 dopant
32 laser light
55 gate electrode
56 source electrode
57 drain electrode
61 substrate (transparent substrate, insulating substrate)
62 under coat layer
63 gate insulating layer (gate insulating film)
64 insulating layer (interlayer insulating film)
100, 101, 102 semiconductor device
200 display device
210 TFT substrate
212 gate driver (scan line driver circuit)
213 data driver (signal line driver circuit)
214 display controller
215, 216 polarizing plate
220 opposite substrate (CF substrate)
230 liquid crystal layer
240 backlight unit
250 pixel
252 pixel electrode
254 scan line (gate bus line)
256 signal line (data bus line)
258 auxiliary capacitance line
260 display region
261 power circuit
262 memory
264 common driver

The invention claimed is:

1. A semiconductor device, comprising: a first P-type TFT; a second P-type TFT; a first N-type TFT; and a second N-type TFT, each of which has a channel region that is made of polycrystalline silicon,
wherein at least three values out of impurity concentrations d1, d2, d3, and d4 differ from each other, and d1, d2, d3, and d4 satisfy relations of
d1<d2 and d3<d4,
where d1, d2, d3, and d4 respectively represent p-type impurity concentrations in the respective channel regions in the first P-type TFT, the second P-type TFT, the first N-type TFT, and the second N-type TFT,
wherein the first P-type TFT and the second N-type TFT are high-voltage driven TFTs, and the second P-type TFT and the first N-type TFT are low-voltage driven TFTs that control a source-drain voltage lower than a source-drain voltage controlled by the high-voltage driven TFTs, and
wherein three values out of d1, d2, d3, and d4 differ from each other, and two values out of d1, d2, d3, and d4 are equal to each other.

2. The semiconductor device according to claim 1, wherein d1, d2, d3, and d4 satisfy a relation of d1<d2=d3<d4 or a relation of d1=d3<d2<d4.

* * * * *